(12) United States Patent
Sugiyama et al.

(10) Patent No.: US 8,383,947 B2
(45) Date of Patent: Feb. 26, 2013

(54) CONDUCTOR MODULE AND ELECTROMAGNETIC WELDING METHOD

(75) Inventors: Yoshitaka Sugiyama, Shizuoka (JP); Kenichi Hanazaki, Shizuoka (JP); Tomokatsu Aizawa, Tokyo (JP)

(73) Assignee: Yazaki Corporation, Tokyo (JP)

( * ) Notice: Subject to any disclaimer, the term of this patent is extended or adjusted under 35 U.S.C. 154(b) by 578 days.

(21) Appl. No.: 12/585,101

(22) Filed: Sep. 3, 2009

(65) Prior Publication Data

US 2010/0059254 A1   Mar. 11, 2010

(30) Foreign Application Priority Data

Sep. 8, 2008   (JP) ................... 2008-229738

(51) Int. Cl.
*H05K 1/00* (2006.01)
(52) U.S. Cl. ..................................... 174/254
(58) Field of Classification Search .............. 174/254, 174/88, 250, 256, 262, 263; 361/306.1, 312, 361/313, 320, 321.2, 738
See application file for complete search history.

(56) References Cited

U.S. PATENT DOCUMENTS

| | | | |
|---|---|---|---|
| 6,607,780 B1 * | 8/2003 | Natarajan et al. | 156/89.12 |
| 2007/0029103 A1 * | 2/2007 | Hanasaki et al. | 174/88 R |
| 2008/0149371 A1 * | 6/2008 | Schrooten | 174/254 |

FOREIGN PATENT DOCUMENTS

| | | |
|---|---|---|
| JP | 05-121139 A | 5/1993 |
| JP | 11-192562 A | 7/1999 |
| JP | 2006-310016 A | 11/2006 |
| JP | 2008-126235 A | 6/2008 |

OTHER PUBLICATIONS

Japanese Office Action dated Oct. 23, 2012 for Application No. 2008-229738.

\* cited by examiner

*Primary Examiner* — Jeremy Norris
*Assistant Examiner* — Tremesha S Willis
(74) *Attorney, Agent, or Firm* — Edwards Wildman Palmer LLP

(57) ABSTRACT

The present invention is intended to provide an enhanced conductor module capable of reducing a joint area between conductors, and a method for preparing the same. The conductor module has a pair of flattened circuits each of which comprises a rectangular shaped conductors, a pair of sheeted coverings disposed on both sides of the conductor, and at least one hole having a diameter smaller than a width of the conductor, and formed in the coverings so as to expose one surface of the conductor to outside the flattened circuit. The conductor of one flattened circuit is joined to the conductor of the other flattened circuit via the hole by application of electromagnetic welding.

7 Claims, 8 Drawing Sheets

FIG. 9
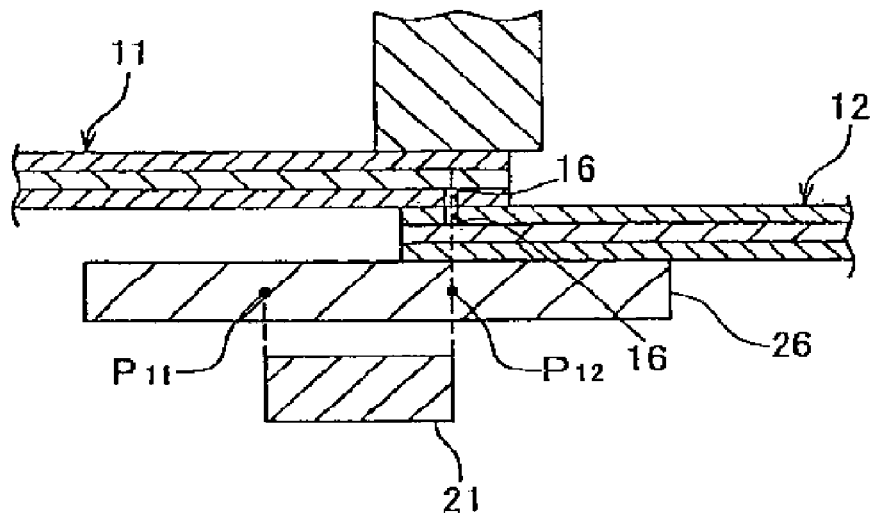
FIG. 10
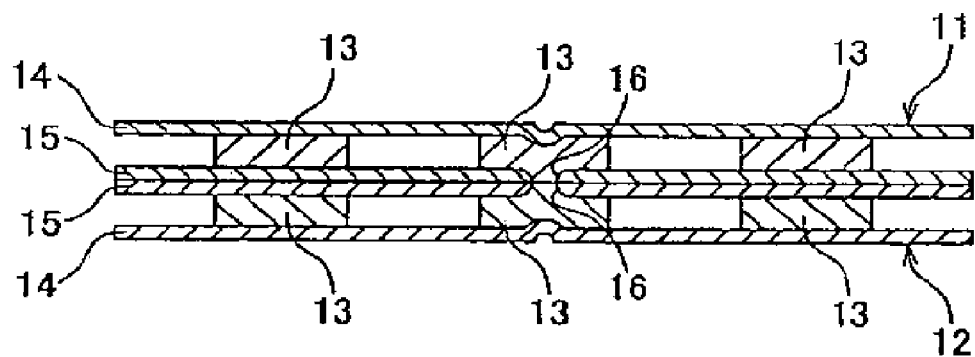
FIG. 11 -- Prior Art --
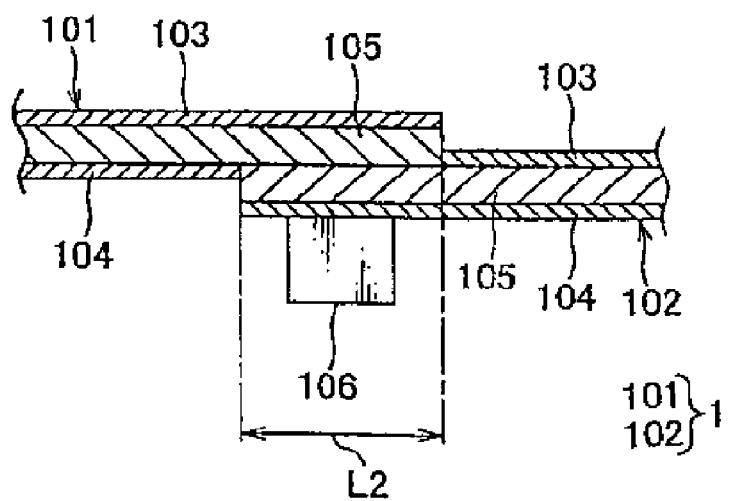

FIG. 12 -- Prior Art --
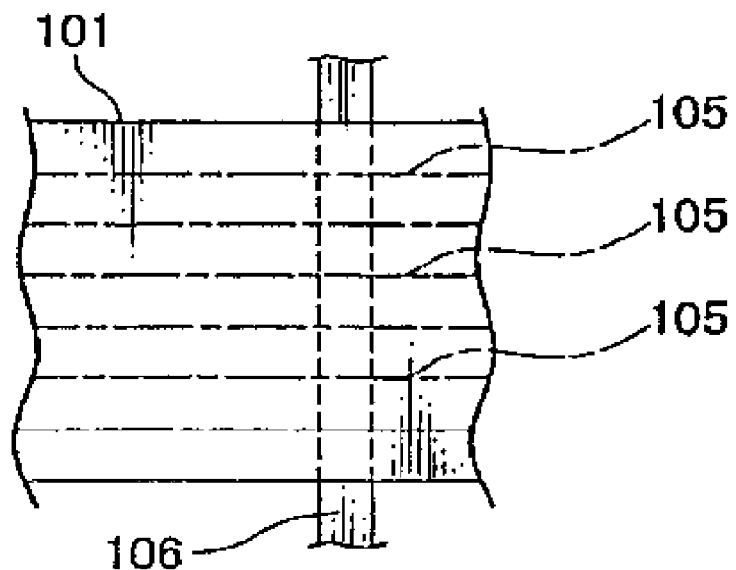
FIG. 13
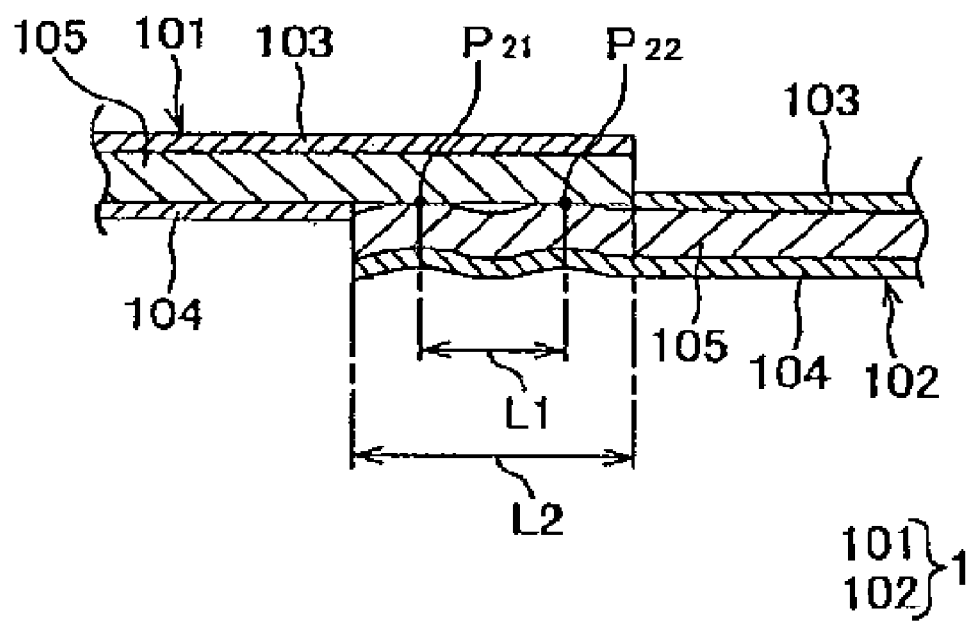

CONDUCTOR MODULE AND ELECTROMAGNETIC WELDING METHOD

CROSS-REFERENCE TO RELATED APPLICATIONS

The present Application claims priority to Japanese Patent Application No. 2008-229738 filed Sep. 8, 2008, the entire disclosure of which is expressly incorporated herein by reference.

BACKGROUND OF THE INVENTION

1. Field of the Invention

The present invention relates to a conductor module and an electromagnetic welding method for producing the conductor module. In particular, the conductor module is provided with a pair of flattened circuit that comprises a plurality of rectangular shaped conductors, and a pair of sheeted coverings disposed on both sides of the conductors. The conductors are joined together by application of electromagnetic welding.

2. Description of the Related Art

Usually, a variety of electronic devices are mounted to automobile as a vehicle. There is a wiring harness disposed in an automobile so as to deliver or transmit electricity from the battery of the electronic devices or control signal from a control device. The wiring harness is comprised of an electrical conduit, and a terminal fitting made of metallic plate and connected to the end portion of the electrical conduit. The electrical conduit is comprised of a core portion and a covering portion disposed on the core portion.

An automobile having multi-functionality has been continuously required. Accordingly, the number of electronic devices received in an automobile is continuously increasing. As a result, electrical conduits used in wiring harness correspondingly have a tendency to increase, and thus the mass and volume of the wiring harness is also increasing.

For the reasons set forth above, a flattened circuit (i.e., a flat circuit) such as a flat flexible cable (i.e., FFC) and a flexible printed circuit (i.e., FPC) have been proposed as the aforementioned electrical conduit for the wiring harness for the purpose of reduction in size and weight.

The flattened circuit includes a plurality of rectangular-shaped conductors and a pair of sheet-like covering disposed on both sides of the conductors, and is formed into a strip. The conductors are respectively linearly extended. The conductors are positioned in parallel with each other. The covering is configured to insulate one conductor from the other conductor.

In the afore-mentioned flattened circuit, the conductors are joined together by soldering. Soldering may adversely affect the flattened circuit in terms of durability and environment, and cause crack generation. Furthermore, due to the soldering portion, prepare cost also rises.

Otherwise, the conductors can be joined together by ultrasonic jointing and laser jointing. For more details, see Japanese Publication of Patent Application No. H11-192562. However, in the case of ultrasonic jointing and laser bonding, the conductors are joined together with the covering portion being left. In other words, (ultrasonic) energy is also applied to the covering portion. As a result, the covering portion may be damaged. For preventing the above damage, the covering portion must be partly eliminated. In this case, the electrical conduit is subject to corrosion, and thus electrical insulation may not be securely guaranteed.

Novel approach for joining conductors together has been proposed in Japanese Publication of Patent Application 2006-310016. In this document, the conductors are joined together while the covering portion remaining. The afore-mentioned method can be also designated as "electromagnetic welding method" which is thereafter described in detail. Referring to FIG. 11, each covering portion (103, 104) is eliminated from the each end portion of a pair of flattened circuits (101, 102) which are a part of conductor modules (1). As a result, one surface of the conductor (105) is completely exposed. Subsequently, one conductor is superposed to the other conductor such that the exposed surface of the one conductor (105) is in a closely contact with the exposed surface of the other conductor (105), as shown in FIG. 11. The superposed body thus obtained is disposed on a coil (106).

In this configuration the coil (106) and the conductor (105) are generally at right angles together in view of longitudinal direction, as shown in FIG. 12. In other words, the end portion of conductor (105) is disposed over the coil (106). In a case where electric current is applied to the coil (106) producing a magnetic field, excess current is generated in the area of the conductor (105). The magnetic flux generated in the area of the coil (106) and the magnetic flux generated in the area of the conductor (105) disposed adjacent to the coil (106) repel each other, and thus the conductor (105) disposed over the coil (106) has a tendency to move in a direction away from the coil (106) colliding the other conductor (105). High pressure generated in the event of collision allows the conductors to join together.

Meanwhile, in a case where the length of the exposed portion (L2) of the conductor (105) is less than the width of the coil (106), the conductors (105) would not join together. Accordingly, the length (L2) should be greater than the width of the coil (106). In this case, highly downsized and integrated circuit cannot be achieved.

To overcome above drawback, the coil (106) having smaller width and the conductor (105) having shorter exposed portion (L2) has been considered. However, the coil (106) having less width provides less heat capacity. In other words, when high current is applied to the coil (106), the coil (106) due to heat may be molten. Moreover, magnetic pressure generated in the event of joining the conductors together may easily deform the coil (106). Furthermore, according to prior art, all the conductors (105) disposed between the coverings (103, 104) are joined together. Accordingly, one drawback of prior art is that one cannot select the conductor (105) to be joined.

To overcome the afore-mentioned problems and drawbacks, there are provided an improved conductor module and magnetic pressure welding method capable of reducing or minimizing the joint area of the conductors.

SUMMARY OF THE INVENTION

The inventors have deeply researched and studied why the conductors (105) having the length of the exposed portion less than the width of the coil (106) fails to be joined together, and have finally found the reason. When the conductors (105) are joined together by means of an electromagnetic welding apparatus, two jointing points ($P_{21}$, $P_{22}$) are formed, as shown in FIG. 13. The jointing point is formed is a position in which the vertical component of the flattened circuit reaches a maximum in a magnetic field that is produced by the coil (106) intersecting with the conductors (105). In practice, two jointing points ($P_{21}$, $P_{22}$) are present in the magnetic field. In this configuration, the vertical direction corresponds to the direction in which the conductor (105) moves. The distance (L1)

between two jointing points ($P_{11}, P_{12}$) is substantially equal to the width of the coil (105). Due to the reason as set forth above, the conductors (105) having the length (L2) of the exposed portion less than the width of the coil (106) cannot but fail to be joined together. Accordingly, the present invention is based on the above findings.

In accordance with the first aspect of the invention, there is provided a conductor module having a pair of flattened circuits. The flattened circuit comprises a rectangular shaped conductor, a pair of sheeted coverings disposed on both sides of the conductor, and at least one hole having a diameter smaller than a width of the conductor, and formed in the coverings so as to expose one surface of the conductor to outside the flattened circuit. The conductor of one flattened circuit is joined to the conductor of the other flattened circuit via the hole by application of electromagnetic welding. As used herein, the term "electromagnetic welding" refers to welding conductors together by pressure generated when the conductors collide with each other. In particular, an electromagnetic field generated by the coil acts on one conductor, and then the affected conductor moves toward the other conductor. In such a manner, the collision between the conductors occurs.

Preferably, the conductors are magnetically welded together by disposing the flattened circuits over a coil such that the overlapping holes are situated in a position in which a vertical component of the flattened circuits reaches a maximum in a magnetic field, and subsequently applying a current to the coil. The magnetic field is generated from the coil and intersects with the conductor.

Preferably, the conductors are magnetically welded together by disposing the flattened circuits over a coil such that the overlapping holes are situated in a position in which a vertical component of the flattened circuits reaches a maximum in a magnetic field generated from the coil and intersecting with a moving member, and subsequently applying a current to the coil. The moving member is disposed between the coil and the flattened circuits.

Preferably, a plurality of the conductors is disposed between a pair of the coverings, and the hole is configured to partly expose the conductors to outside the flattened circuits.

Preferably, the covering is produced by a process, comprising the steps of:
  applying molten material for the covering to one surface of the conductor;
  forming a resist film layer on the covering except for a portion to be the hole; and
  etching the covering so as to form the hole on the covering.

In accordance with the second aspect of the invention, there is provided a method for joining conductors of a pair of flattened circuits together. Each of the flattened circuit comprises a rectangular shaped conductor, a pair of sheeted coverings disposed on both sides of the conductor, and at least one hole having a diameter smaller than a width of the conductor, and being formed in the covering so as to expose one surface of the conductor to outside the flattened circuit. The method comprises the steps of:
  disposing the flattened circuits over a coil such that the overlapping holes are situated in a position in which a vertical component of the flattened circuit reaches a maximum in a magnetic field, the magnetic field being generated from the coil and intersecting with the conductor; and
  applying a current to the coil so as to magnetically weld the conductors together.

In accordance with the third aspect of the invention, there is provided a method for joining conductors of a pair of flattened circuits together. Each of the flattened circuit comprises a rectangular shaped conductor, a pair of sheeted coverings disposed on both sides of the conductor, and at least one hole having a diameter smaller than a width of the conductor, and being formed in the covering so as to expose one surface of the conductor to outside the flattened circuit. The method comprises the steps of:
  disposing the flattened circuits over a coil such that the overlapping holes are situated at a position in which a vertical component of the flattened circuit reaches a maximum in a magnetic field generated from the coil and intersecting with a electrically conductive moving member, the moving member being thicker than the conductor and being disposed between the coil and the flattened circuits; and
  applying a current to the coil so as to magnetically weld the conductors together.

BRIEF DESCRIPTION OF THE DRAWINGS

FIGS. 4A to 4D are provided for brief illustration of a process for producing the flexible printed circuit depicted in FIG. 1.

FIG. 9 is another partial cross-sectional view showing conductors disposed over the coil of the electromagnetic welding apparatus depicted in FIG. 5.

FIG. 10 is an exploded perspective view showing another conductor module in accordance with the present invention.

FIG. 11 is a cross-sectional view illustrating conventional electromagnetic welding method.

FIG. 12 is a top view illustrating conventional electromagnetic welding method.

FIG. 13 is a cross-sectional view showing an exemplary conductor module produced by a conventional electromagnetic welding method.

DETAILED DESCRIPTION OF THE INVENTION

Figure 1:
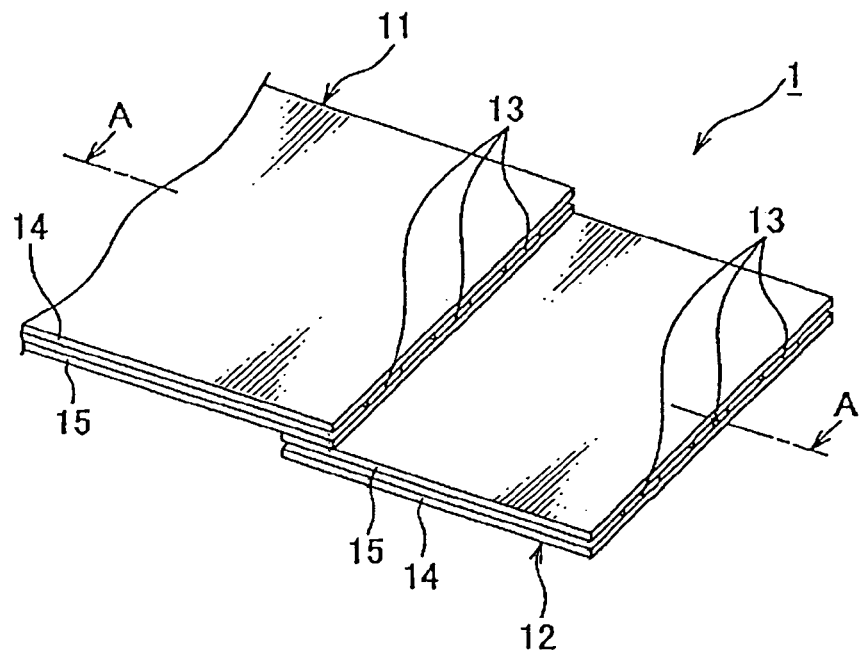
FIG. 1 is a perspective view showing one embodiment of a conductor module in accordance with the present invention.
Figure 2:
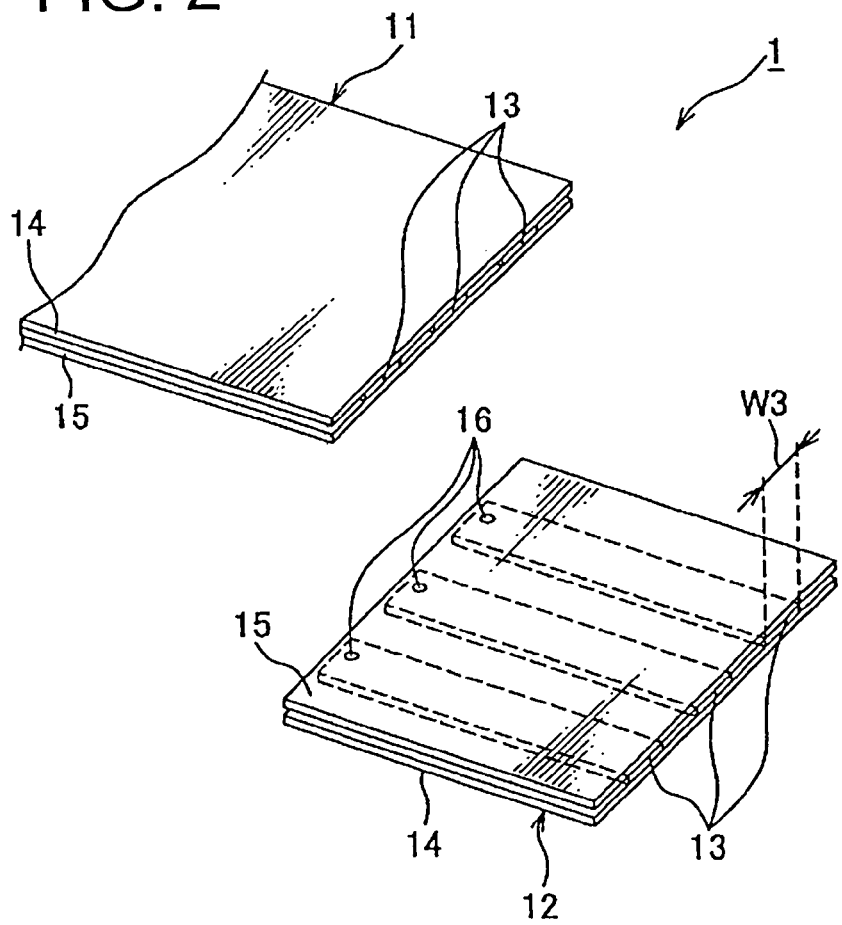
FIG. 2 is an exploded perspective view showing the conductor module depicted in FIG. 1.

The present invention will be described in detail with reference with drawings attached thereto. According to one embodiment of magnetic pressure welding method in accordance with the present invention, a conductor module is assembled as shown in FIG. 1. The conductor module 1 includes two flexible printed circuits (11, 12) as shown in FIGS. 1 and 2. As used herein, the term "flexible printed circuit" can be exchanged with the term "flattened circuit".

The cross section of each flexible printed circuit (11, 12) is rectangular. With reference to FIGS. 1 and 2, each flexible flattened circuit (11, 12) includes a plurality of rectangular-shaped conductors (13) and a pair of sheet-like coverings (14, 15) disposed on both sides of the conductor (13). More specifically, the conductors (13) are disposed between a pair of the coverings (14, 15). The conductor (13) is formed of electrically conductive metal. The conductor (13) also has flexibility. The coverings (14, 15) are formed of synthetic resin having both insulating properties and flexibility.

Figure 3:
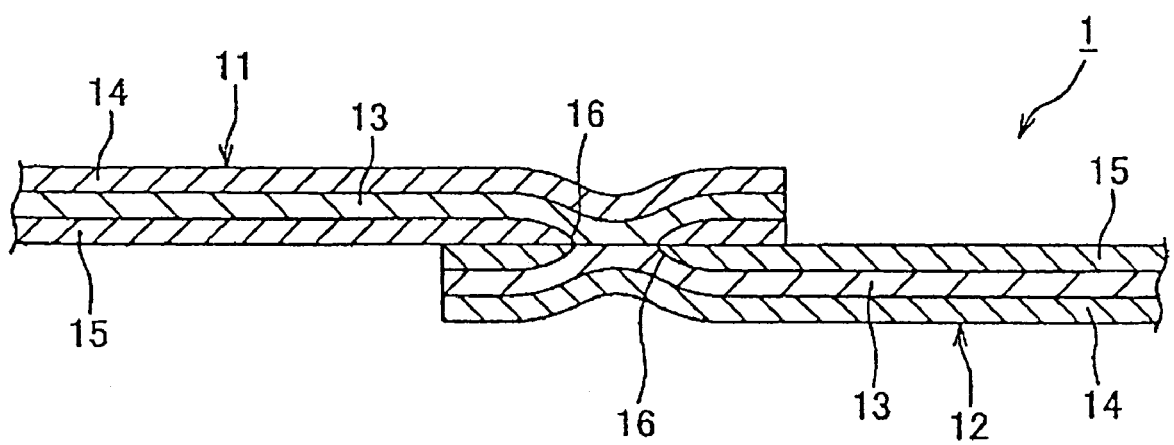
FIG. 3 is a cross-sectional view taken along line A-A in FIG. 1.
Figure 4A:
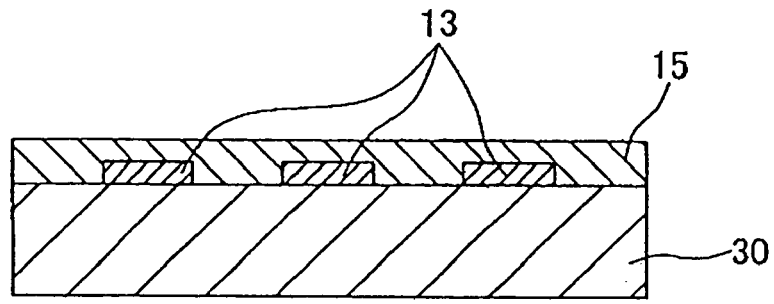
FIGS. 4A to 4D are cross-sectional views showing a flexible printed circuit depicted in FIG. 1.
Figure 4B:
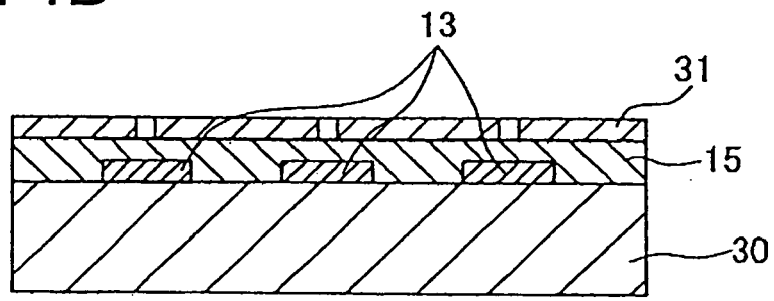
Figure 4C:
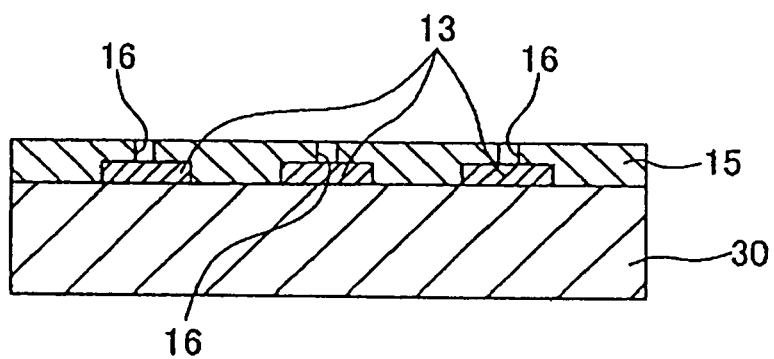
Figure 4D:
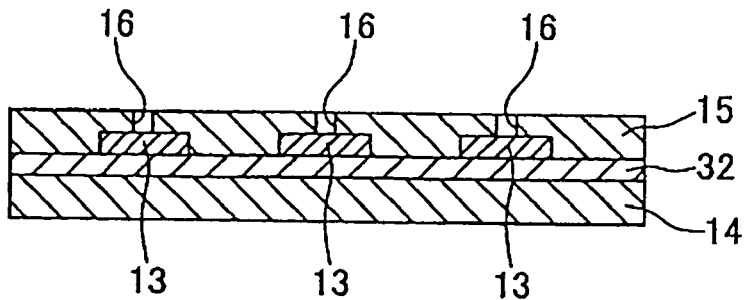

As shown in FIGS. 2 and 3, a hole (16) is formed in the terminal of the covering (15). The hole (16) is configured to expose one surface of the conductor (13) to outside. The hole (16) is circular, and has a diameter smaller than the width (W3) of the conductor (13). In other words, the hole (16) is made such that its diameter is smaller than the length of the conductor (13) in both longitudinal and cross-the-width direction. Furthermore, as shown in FIG. 3, the conductors (13) are joined together via the holes (16) via the hole (16) by the application of electromagnetic welding. In this configuration, the holes (16) which are disposed in a pair of the flexible printed circuits (11, 12) overlap each other.

The above flexible printed circuits (11, 12) are prepared as depicted in FIGS. 4A to 4D. For the first time, the conductor (13) is mounted on a substrate (30). Molten material for the covering (15) is applied to one surface of the conductor (13) so as to form the covering (15). See FIG. 4A. Subsequently, etching liquid is applied onto the covering (15) so as to form a resist film layer (31) capable of protecting the covering (15). Light is put on a position to be the hole (16) to partly eliminate the resist film layer (31). See FIG. 4B. As a result, the resist film layer (31) is disposed on the covering (15) except for the position to be the hole (16). Subsequently, the covering (15) is etched to form the hole (16) and then the resist film layer (31) is eliminated. See FIG. 4C. Subsequently, the substrate (30) is peeled off and then the covering (14) is bonded to the other surface of the conductor (13) by means of adhesive agent (32). In this manner, the above flexible printed circuits (11, 12) can be achieved.

The conductor module (1) can be made by joining the conductors (13) together via the hole (16) by means of an electromagnetic welding apparatus (20). See FIG. 5. The apparatus (20) is shown to include a coil (21), a fixture (22), an electric power supply (23), a capacitor (24), a switch (25), and a moving member (26). The coil (21) is formed of electrically conductive metal, and is made tabular. In other words, the coil (21) is formed of sheet metal. The coil (21) is comprised of a pair of enlarged portions (27) and a narrowed portion (28) which is integrally formed with a pair of the enlarged portions (27). A pair of the enlarged portions (27) is disposed apart from each other. The enlarged portion (27) has a rectangular shape on the basis of its planar view. A pair of the enlarged portions (27) has equivalent length (i.e., width) in a direction perpendicular to the direction in which current flows (K). See FIG. 5. The length is also made such that the flow of an electric current is not prevented.

Figure 6:
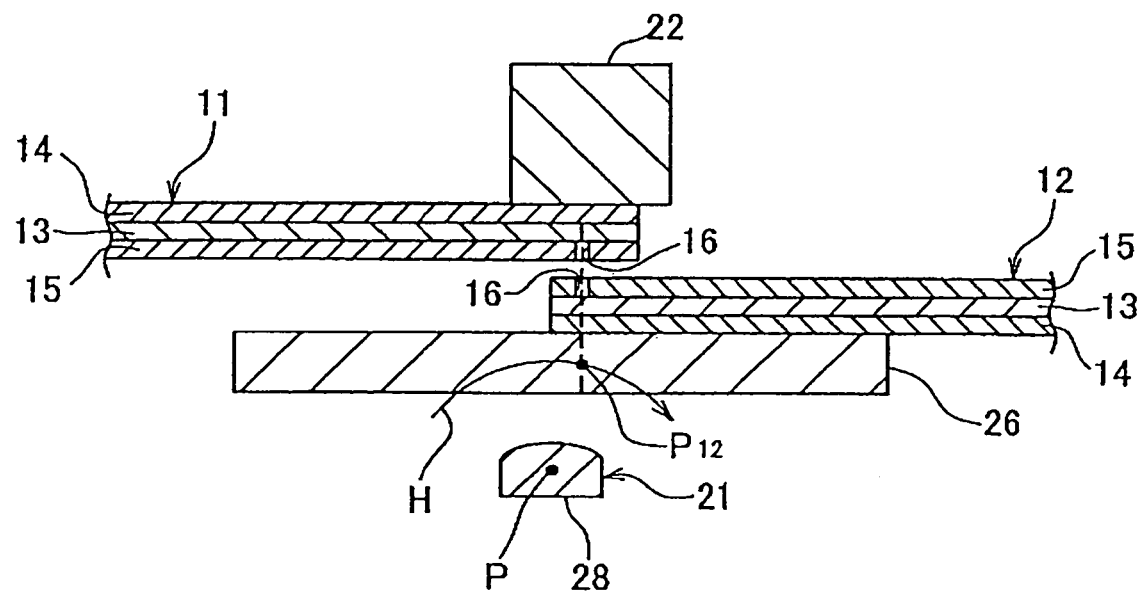
FIG. 6 is a partial cross-sectional view showing conductors disposed over the coil of the electromagnetic welding apparatus depicted in FIG. 5.

The narrowed portion (28) is disposed between a pair of the enlarged portions (27), and is connected to the above two enlarged portions (27) at its both ends. The narrowed portion (28) also has a rectangular shape on the basis of its planar view. As shown in FIG. 6, the cross section of the narrowed portion (28) is hog-backed. The longitudinal direction of the narrowed portion (28) is in parallel with the direction in which current flows (K). The length (i.e., width) of the narrowed portion (28) in a direction perpendicular to the direction in which current flows (K) is less than that of the enlarged portion (27). The narrowed portion (28) allows high current to flow therealong.

The coil (21) generates a magnetic field when current flows therealong. Specifically, a magnetic field (H) is circumferentially generated around a shaft center (P) which bisects both the width and the thickness of the coil (21). Furthermore, the electromagnetic welding apparatus (20) allows the flexible printed circuits (11, 12) to be disposed over the coil (21). As used herein, the coil (21) produces a magnetic field when current flows. In other words, the coil (21) includes, but is not limited to, a coiled conductive wire, a linearly-shaped conductive wire, or a plate-like metal. The coil (21) may be formed in any shape.

The fixture (22) is formed in the shape of quadrangular prism. One end face of the fixture (22) is opposed to the surface of the coil (21), and is spaced apart from the coil (21). The fixture (22) can freely move relative to the coil (21). In other words, the fixture (22) can move in a direction toward the coil (21) or away from the coil (21). In this configuration, two flexible printed circuits (11, 12) can be disposed between the fixture (22) and the coil (21). More specifically, the fixture (22) is superposed on the flexible printed circuits (11, 12) and so on. In other words, the end face of the fixture (22) comes in contact with the top face of the flexible printed circuit (11, 12).

Figure 5:
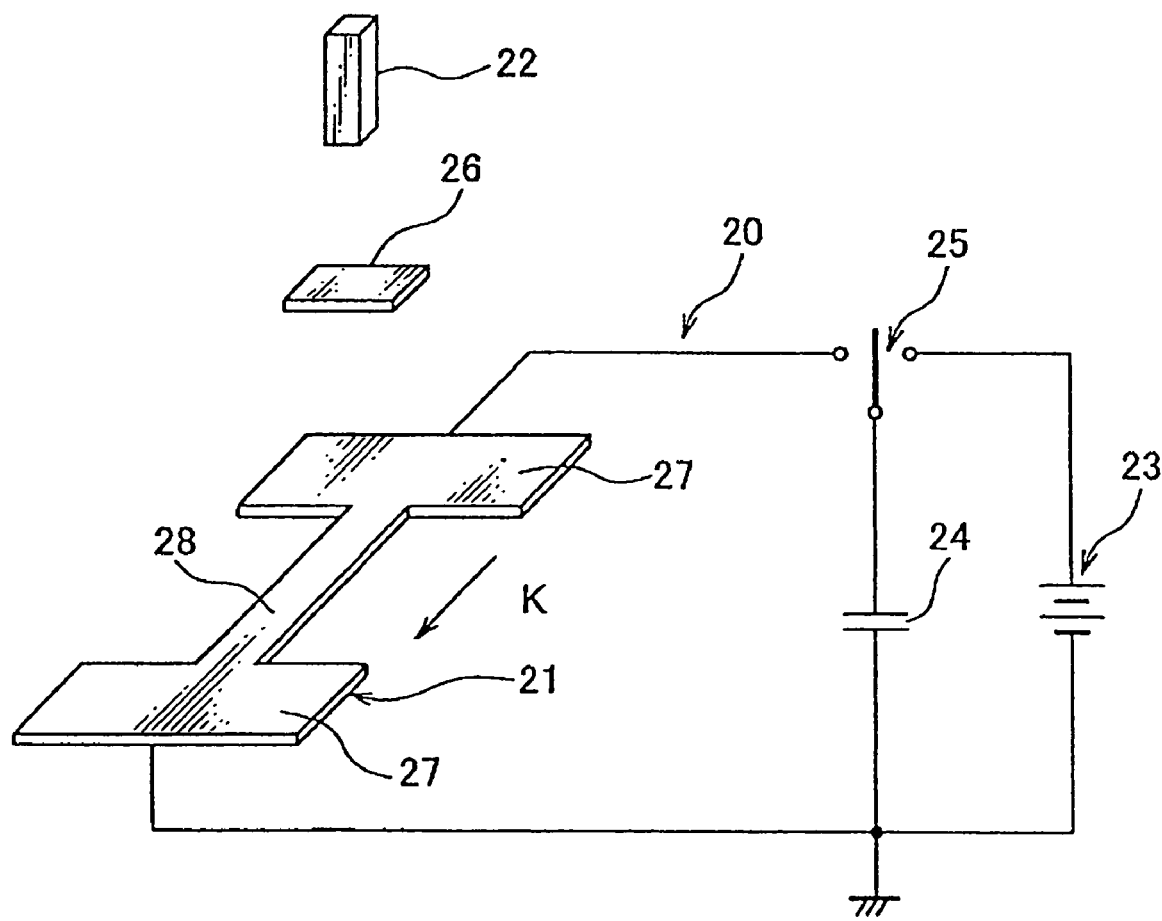
FIG. 5 illustrates one embodiment of an electromagnetic welding apparatus that is used for assembling a conductor module in accordance with the present invention.

The capacitor (24) is connected via the switch (25) to the electric power supply (23) or the coil (21), as shown in FIG. 5. The capacitor (24) is configured to charge electrical energy up to the predetermined level. One contact point (i.e., a first contact point) of the switch (25) is connected to one enlarged portion (27), and both the electric power supply (23) and the capacitor (24) are connected to the other enlarged portion (27). Another contact point of (i.e., a second contact point) of the switch (25) is connected to the electric power supply (23). The other contact point (i.e., a third contact point) of the switch (23) is connected to the capacitor (24)

Due to the switch (25) a condition in which electrical energy is supplied from the electric power supply (23) to the capacitor (24), a condition in which the charged electrical energy is supplied from the capacitor (24) to the coil (21), and a condition in which electrical energy is not supplied from the electric power supply (23) to the capacitor (24) and the charged electrical energy is not supplied from the capacitor (24) to the coil (21) can be switched therebetween.

In a case where the condition in which the charged electrical energy is supplied from the capacitor (24) to the coil (21) is selected by the switch (25), the capacitor (24) outputs via the switch (25) the charged electrical energy toward the enlarged portion (27). Accordingly, the capacitor (24) momentarily applies high current to the coil (21). This high current is greater than the current flowing from the electric power supply (23).

The moving member (26) may be formed of an electrically-conductive, sheet-like metal. The thickness of the moving member (26) is greater than that of the conductor (13). The moving member (26) is disposed between the flexible printed circuits (11, 12) and the coil (21).

In the electromagnetic welding apparatus (20), a pair of objects to be welded is disposed over the coil (21). While the objects being disposed between the coil (21) and the fixture (22), the capacitor (24) is charged up to the predetermined level. This charging process can be controlled by the switch (25). Also the switch (25) momentarily applies high current to the coil (21). The high current is supplied from the capacitor (24). The electromagnetic welding apparatus (20) generates a magnetic field in the area of the objects disposed over the coil (21). In this situation, excess current (i.e., high current) is applied to the both objects to be welded. Accordingly, the objects are heated. Moreover, the electromagnetic welding apparatus (20) generates a magnetic field in the area of the moving member (26) disposed over the coil (21) and thus applies excess current to the moving member (26). Also, in the electromagnetic welding apparatus (20) the magnetic flux generated in the area of the coil (21) and the magnetic flux generated in the area of the moving member (26) due to excess current repel each other, thus causing the moving member (26) to move toward the fixture (22). In this configuration, the moving member (26) pushes the objects upward causing the objects to collide with each other. As a result, the objects are welded together. In other words, the objects are mechanically welded.

Figure 7:
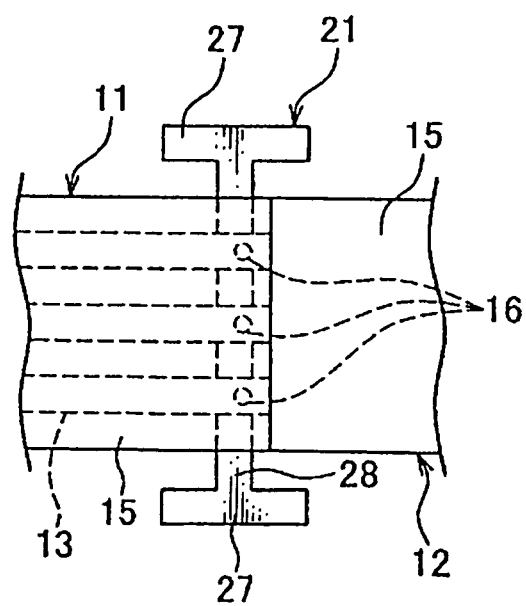
FIG. 7 is partial top (plan) view showing the conductors disposed over the coil of the electromagnetic welding apparatus depicted in FIG. 5.

The flexible printed circuits (11, 12) can be welded together by means of the electromagnetic welding apparatus (20). Referring to FIG. 6, the holes (16) of the flexible printed circuits (11, 12) overlaps each other. Subsequently, a pair of the flexible printed circuits (11, 12) is laid over the narrowed portion (28) of the coil (21) while the moving member (26) disposed between the flexible printed circuits (11, 12) and the coil (21). In this configuration, the flexible printed circuits (11, 12) are laid over the coil (21) such that the hole (16) is disposed over one of peak points ($P_{11}$, $P_{12}$) that will be described thereafter. With reference to FIG. 6, the flexible printed circuits (11, 12) are laid over the coil (21) such that the hole (16) is disposed over the peak point ($P_{12}$). As shown in FIG. 7, the flexible printed circuits (11, 12) are arranged such that the longitudinal direction of the conductor (13) is perpendicular to the longitudinal direction of the narrowed portion (28).

In accordance with the afore-mentioned configuration, the flexible printed circuits (11, 12) can be disposed over the coil (21) such that the hole (16) is disposed over one of peak points ($P_{11}$, $P_{12}$). In this case, the switch (25) should be set at the condition in which electrical energy is not supplied from the electric power supply (23) to the capacitor (24), and is not supplied form the capacitor (24) to the coil (21). In other words, the coil (21), the moving member (26), the covering (14) of the flexible printed circuit (12), the conductor (13) of the flexible printed circuit (12), the covering (15) of the flexible printed circuit (12), the covering (15) of the flexible printed circuit (11), the conductor (13) of the flexible printed circuit (11), and the covering (14) of the flexible printed circuit (11) are arranged at the bottom, as shown in FIG. 6. In this configuration, the flexible printed circuits (11, 12) are spaced apart from each other so as to make possible the collision of conductors (13).

Figure 8:
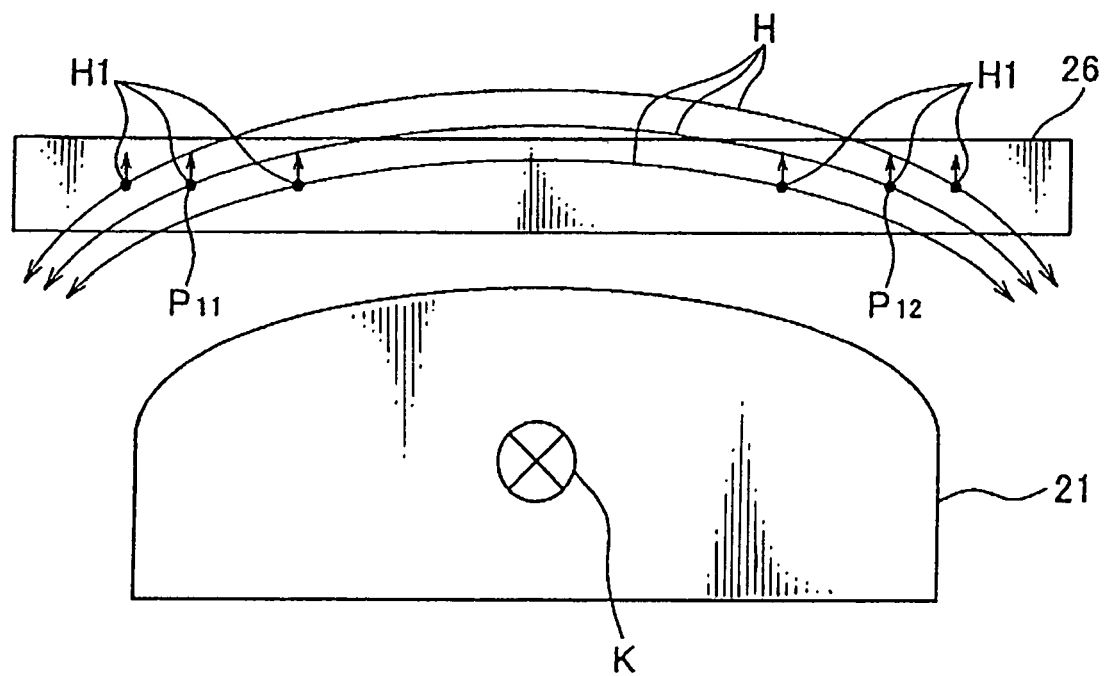
FIG. 8 illustrates peak points that are present in a moving member.

Referring to FIG. 8, the peak points ($P_{11}$, $P_{12}$) will be described in detail. A current flow along the coil (21) produces a magnetic field (H) around the axis which is designated as "K" in FIG. 8. The magnetic field (H) intensity is inversely proportional to the distance from the coil (21). Moreover, the closer the magnetic field (H) intersecting with the moving member (26) comes to the coil (21), the less the rate of the vertical component of the flexible printed circuits (11, 12) is. Accordingly, there is a position in which the vertical component (H1) of the flexible printed circuits (11, 12) reaches a maximum in the magnetic fields (H) that is generated from the coil (21) and intersects with the moving member (26)

Furthermore, there is another position in which the vertical component (H1) of the flexible printed circuits (11, 12) reaches a maximum in the above magnetic field (H) intersecting with the moving member (26). In other words, there are two peak points. This is because the magnetic field (H) intersects with the moving member (26) at two points. Theses peak points in which the vertical component reaches a maximum are considered to correspond to two jointing points ($P_{21}$, $P_{22}$) as described previously (See "Background of Invention").

The flexible printed circuits (11, 12) are arranged such that the hole (16) is disposed over one of the peak points ($P_{11}$, $P_{12}$).

Welding process (i.e., jointing process) will be herein described in detail. Referring to FIG. 6, the end face of the fixture (22) is superposed on the covering (14) of the flexible printed circuit (11). Subsequently, due to switch (25) change charge is accumulated on the capacitor (24) from the electric power supply (23). After the capacitor (24) is charged, the switch (25) is changed. In this situation, accumulated electrical energy is supplied from the capacitor (24) to the coil (21) via the switch (25), and high current that is greater than the current flowing from the electric power supply (23) momentarily flows along the coil (21).

Due to the current flowing along the coil (21), the magnetic field is generated around the coil (21). The magnetic field acts on the conductor (13) of the flexible printed circuits (11, 12) so as to apply excess current to the conductors (13) of the flexible printed circuits (11, 12). The excess current can heat the conductors (13) of a pair of the flexible printed circuits (11, 12). Furthermore, the magnetic field also acts on the moving member (26) so as to apply excess current to the moving member (26). The magnetic flux generated in the area of the coil (21) and the magnetic flux generated in the area of the moving member (26) due to excess current repel each other, thus allowing the moving member (26) to move toward the fixture (22). In this configuration, the moving member (26) pushes the flexible printed circuit (12) adjacent to the coil (21) upward causing the conductors (13) of the flexible printed circuits (11, 12) to collide with each other. As a result, the conductors (13) are welded together. In accordance with the afore-mentioned welding process, one embodiment of the conductor module (1) in accordance with the present invention can be obtained.

However, the peak points ($P_{11}$, $P_{12}$) disposed in the moving member (26) can vary depending on the shape and size of the coil (21), and a current flowing along the coil (21). Furthermore, in order to position the hole (16) over the peak point (11, 12) located inside the moving member (26), a pair of object to be welded can may be disposed between the fixture (22) and the coil (21). In this case, the object has a width greater than that of the coil (21). Subsequently, current is applied to the coil (21), and thus the objects are welded together. Considering the jointing points ($P_{21}$, $P_{22}$) located inside the objects as the peak point ($P_{11}$, $P_{12}$), relative position of the peak point ($P_{11}$, $P_{12}$) can be determined with respect to the coil (21). The hole (16) is disposed on the relative position as determined above.

In accordance with the afore-mentioned embodiment of the present invention, the hole (16) formed in the covering (15) of one flexible printed circuit overlaps with the hole (16) formed in the covering (15) of the other flexible printed circuit. The hole (16) has a diameter smaller than the width of the conductor (13) one surface of which is exposed via the hole (16) to outside. The hole (16) is disposed over the coil (21) such that it is disposed over one of peak points ($P_{11}$, $P_{12}$) in which the vertical component (H1) of the flexible printed circuits (11, 12) reaches a maximum in the magnetic field (H) that is arisen from the coil (21) and intersects with the moving member (26). Subsequently, a current is applied to the coil (21) so as to electromagnetically weld the conductors (13) together. Therefore, it is possible to form the hole (16) having a diameter smaller than the width of the conductor (13), thus reducing the joint area between the conductors (13).

In accordance with the above embodiment of the present invention, when the conductor (13) is thin, and a magnetic flux generated on the side of the conductor (13) adjacent to the coil (21) is weak, colliding force between the conductors (13)

is too weak to magnetically weld the conductors (13) together. In order to avoid the afore-mentioned defect or phenomenon, the moving member (26) having a thickness greater than that of the conductor (13) should be employed. In this case, stronger magnetic flux can be produced, thus allowing stronger collision force between the conductors (13). Therefore, the conductors (13) can be securely joined together.

In a case where the covering (15) having the hole (16) disposed thereon is conventionally attached to one surface of the conductor (13) by means of adhesive agent, adhesive agent leak may result in incomplete or poor joint between the conductors (13). However, in accordance with the above embodiment, the covering (15) having the hole (16) disposed thereon can be bonded to one surface of the conductor (13) without using the adhesive agent, as shown in FIG. 4. Therefore, poor joint between the conductors (13) can be effectively prevented.

In accordance with the above embodiment of the present invention, the enlarged portion (27) of the coil (21) has a hog-backed cross section. However, the coil (21) is not limited to afore-mentioned configuration. In other words, the coil (27) can be formed in any shape. For example, referring to FIG. 9, the coil (21) has a rectangular cross section. In the former, the peak points ($P_{11}$, $P_{12}$) are generally arranged inwardly from the both sides of the enlarged portion (27). Refer to FIG. 6. In the latter, the peak points ($P_{11}$, $P_{12}$) are arranged along the both sides of the enlarged portion (27), which makes it easier to position the hole (16) relative to the peak points ($P_{11}$, $P_{12}$). Refer to FIG. 9.

In accordance with the above embodiment of the present invention, the hole (16) is formed in a circle. However, in accordance with the present invention, the shape of the hole (16) is not limited to the above circular form. In other words, the hole (16) may be formed in any shape.

Furthermore, in accordance with the above embodiment of the present invention, the moving member (26) is disposed between the flexible printed circuit (12) and the coil (21). However, the present invention is not limited the afore-mentioned configuration. For example, in a case where the conductor (13) of the flexible printed circuit (12) adjacent to the coil (21) has a certain measure of thickness, the moving member (26) can be omitted. In this case, the hole (16) can be disposed over the peak points ($P_{11}$, $P_{12}$) in which the vertical component of the magnetic field intersecting with the conductor (13) reaches a maximum.

In accordance with the above embodiment of the present invention, the hole (16) is arranged on all the conductors (13) which are disposed between a pair of the coverings (14, 15). However, the present invention is not limited to the afore-mentioned configuration. As shown in FIG. 10, the hole (16) can be formed in the selected conductors (13) which are intended to weld together. In other words, the hole (16) is not necessarily formed on all of the conductors (13). Therefore, among a plurality of conductors (13) the conductors (13) intended for welding can be selectively welded together.

In accordance with the above embodiment of the present invention, a pair of the flexible printed circuits (11, 12) is disposed between the fixture (22) and the coil (21). The present invention is not limited to the afore-mentioned configuration. For example, instead of the fixture (22) another separate coil can be also employed. In other word, a pair of the flexible printed circuits (11, 12) can be disposed between a pair of coil.

Several advantages with respect to the present invention will be hereinafter described.

In accordance with one aspect of the present invention, the conductors can be joined together via the hole by application of electromagnetic welding which makes it possible to reduce joint area of the conductors. As stated previously, the hole has a diameter smaller than a width of the conductor.

In accordance with the other aspect of the present invention, the moving member having a thickness greater than that of the conductor is employed. Accordingly, even if the conductor is thin and a magnetic flux generated on the side of the conductor adjacent to the coil is weak, stronger magnetic flux can be produced due to the use of moving member, thus allowing stronger collision force between the conductors. Therefore, the conductors can be securely joined together.

In accordance with another aspect of the present invention, the hole is arranged so as to partly expose the conductors to outside the flattened circuit. Therefore, among a plurality of conductors (13) the conductors (13) intended for welding can be selectively welded together.

In accordance with additional aspect of the present invention, the covering having the hole disposed thereon can be bonded to one surface of the conductor without using the adhesive agent. Therefore, poor joint between the conductors can be effectively prevented.

The above embodiments and examples are given to illustrate the scope and spirit of the instant invention. These embodiments and examples will make apparent, to those skilled in the art, other embodiments and examples. These other embodiments and examples are within the contemplation of the present invention. Therefore, the instant invention should be limited only by the appended claims.

The invention claimed is:

1. A conductor module having a pair of flattened circuits, each of the flattened circuit comprising:
   a rectangular shaped conductor,
   a pair of sheeted coverings disposed on both sides of the conductor, and
   at least one hole having a diameter smaller than a width of the conductor, and formed in the coverings so as to expose one surface of the conductor to outside the flattened circuit, wherein the flattened circuits are disposed over a coil, which is capable of generating a magnetic field intersecting with the conductor, such that the overlapping holes are situated in a position in which a vertical component of the flattened circuits reaches a maximum in a magnetic field, and wherein the conductor of one flattened circuit is electromagnetically welded via the hole to the conductor of the other flattened circuit due to a current applied to the coil.

2. The conductor module in accordance with claim 1, wherein a plurality of the conductors is disposed between a pair of the coverings, and the hole is configured to partly expose the conductors to outside the flattened circuits.

3. The conductor module in accordance with claim 1, wherein the covering is produced by a process, comprising the steps of:
   applying molten material for the covering to one surface of the conductor;
   forming a resist film layer on the covering except for a portion to be the hole; and
   etching the covering so as to form the hole on the covering.

4. A conductor module having a pair of flattened circuits, each of the flattened circuit comprising:
   a rectangular shaped conductor,
   a pair of sheeted coverings disposed on both sides of the conductor, and
   at least one hole having a diameter smaller than a width of the conductor, and formed in the coverings so as to expose one surface of the conductor to outside the flattened circuit, wherein the conductor of one flattened circuit is joined to the conductor of the other flattened circuit via the hole by application of electromagnetic welding, and wherein, the conductors are magnetically welded together by disposing the flattened circuits over a coil such that the overlapping holes are situated in a position in which a vertical component of the flattened circuits reaches a maximum in a magnetic field generated from the coil and intersecting with a moving member, the moving member being disposed between the coil and the flattened circuits; and subsequently applying a current to the coil.

5. The conductor module in accordance with claim 1, wherein a plurality of conductors have flexibility.

6. The conductor module in accordance with claim 1, wherein the coverings are formed of synthetic resin having flexibility.

7. The conductor module in accordance with claim 1, wherein the hole is formed in the terminal of the covering.

* * * * *